United States Patent
Chang et al.

(10) Patent No.: US 10,504,832 B2
(45) Date of Patent: *Dec. 10, 2019

(54) METHOD FOR MANUFACTURING COPPER LAYER

(71) Applicant: TAIWAN SEMICONDUCTOR MANUFACTURING COMPANY LTD., Hsinchu (TW)

(72) Inventors: Ken-Yu Chang, Hsinchu (TW); Hung-Wen Su, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,157

(22) Filed: Jan. 5, 2016

(65) Prior Publication Data
US 2016/0126185 A1    May 5, 2016

Related U.S. Application Data

(63) Continuation of application No. 14/279,360, filed on May 16, 2014, now Pat. No. 9,240,378.

(51) Int. Cl.
| | | |
|---|---|---|
| H01L 23/522 | (2006.01) | |
| H01L 23/532 | (2006.01) | |
| H01L 23/528 | (2006.01) | |
| H01L 21/285 | (2006.01) | |
| H01L 21/768 | (2006.01) | |

(Continued)

(52) U.S. Cl.
CPC ........ *H01L 23/5226* (2013.01); *C23C 14/046* (2013.01); *C23C 14/165* (2013.01); *C23C 14/345* (2013.01); *C23C 14/35* (2013.01); *H01L 21/2855* (2013.01); *H01L 21/76816* (2013.01); *H01L 21/76843* (2013.01); *H01L 21/76846* (2013.01); *H01L 21/76849* (2013.01); *H01L 21/76873* (2013.01); *H01L 21/76877* (2013.01); *H01L 21/76879* (2013.01); *H01L 23/528* (2013.01); *H01L 23/5283* (2013.01);

(Continued)

(58) Field of Classification Search
CPC .......... H01L 23/5226; H01L 21/76877; C23C 14/345
See application file for complete search history.

(56) References Cited

U.S. PATENT DOCUMENTS

| | | | | |
|---|---|---|---|---|
| 4,792,842 A | * | 12/1988 | Honma | ............. H01L 21/76877 257/763 |
| 9,240,378 B2 | * | 1/2016 | Chang | ............... H01L 21/76816 |

(Continued)

*Primary Examiner* — Lex H Malsawma
*Assistant Examiner* — Laura M Dykes
(74) *Attorney, Agent, or Firm* — WPAT, P.C., Intellectual Property Attorneys; Anthony King

(57) ABSTRACT

A method of forming a semiconductor structure includes the steps: providing a substrate; forming a dielectric over the substrate; forming an opening recessed under a top surface of the dielectric; forming a barrier layer on a sidewall of the opening; performing a physical vapor deposition (PVD) to form a copper layer over the barrier layer, a corner of the opening intersecting with the top surface and the top surface with a predetermined resputter ratio so that the ratio of the thickness of the copper layer on the barrier layer and the thickness of the copper layer over the top surface is substantially greater than 1.

20 Claims, 6 Drawing Sheets

(51) Int. Cl.
*C23C 14/04* (2006.01)
*C23C 14/16* (2006.01)
*C23C 14/34* (2006.01)
*C23C 14/35* (2006.01)

(52) U.S. Cl.
CPC .. *H01L 23/53238* (2013.01); *H01L 23/53252* (2013.01); *H01L 2924/0002* (2013.01)

(56) References Cited

U.S. PATENT DOCUMENTS

| | | | |
|---|---|---|---|
| 2002/0027287 A1* | 3/2002 | Takagi | H01L 21/76832 257/758 |
| 2009/0209098 A1* | 8/2009 | Su | H01L 21/2855 438/653 |
| 2014/0117550 A1* | 5/2014 | Motoyama | H01L 21/76882 257/751 |
| 2016/0242278 A1* | 8/2016 | Yoshida | H05K 3/4652 |

* cited by examiner

METHOD FOR MANUFACTURING COPPER LAYER

CROSS-REFERENCE TO RELATED APPLICATIONS

This application is a continuation of U.S. application Ser. No. 14/279,360, filed May 16, 2014.

FIELD

The present disclosure relates to a semiconductor device. In particular, the present disclosure relates to a semiconductor structure and method for manufacturing the same.

BACKGROUND

Modern semiconductor packages are formed from multiple stacked material layers that may include numerous active devices electrically coupled together by conductive metal interconnects and lines. High speed semiconductor devices can be formed using a combination of copper interconnects with suitable dielectric materials or films such as low-k dielectrics to take advantage of the superior conductivity of copper and reduced parasitic capacitance between the conductors.

Back end-of-line ("BEOL") fabrication processes are used to create an intricate network of conductive interconnects in each layer and between the multiple layers. An additive patterning process referred to as "dual damascene" is one BEOL process used to form patterned copper conductor circuits in chip packages which interconnect various active components (e.g., resistors, transistors, etc.) disposed in single and multiple layers throughout the chip. Some of these interconnect circuit structures include within-layer trenches or lines filled with the copper to form circuits within a layer and between-layer vias which are essentially metal-plated or filled holes that electrically connect circuits between devices in the multiple layers of the semiconductor package.

As semiconductor technology pushes to 10 nanometer (N10) and below scale, a manufacture operation for metal deposition, such as physical vapor deposition (PVD) seed and electrochemical plating (ECP) Cu deposition, generally has serious overhangs. The severe overhangs seriously decrease continuous sidewall coverage and generate inside voids due to pinch-off. Conventional metal reflowing approach needs the special wetting layer or harsh metallization operation, which is not favorable for manufacturing. The conventional PVD gap-fill approach could not fill the small dimension feature such as 38 nanometer or below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
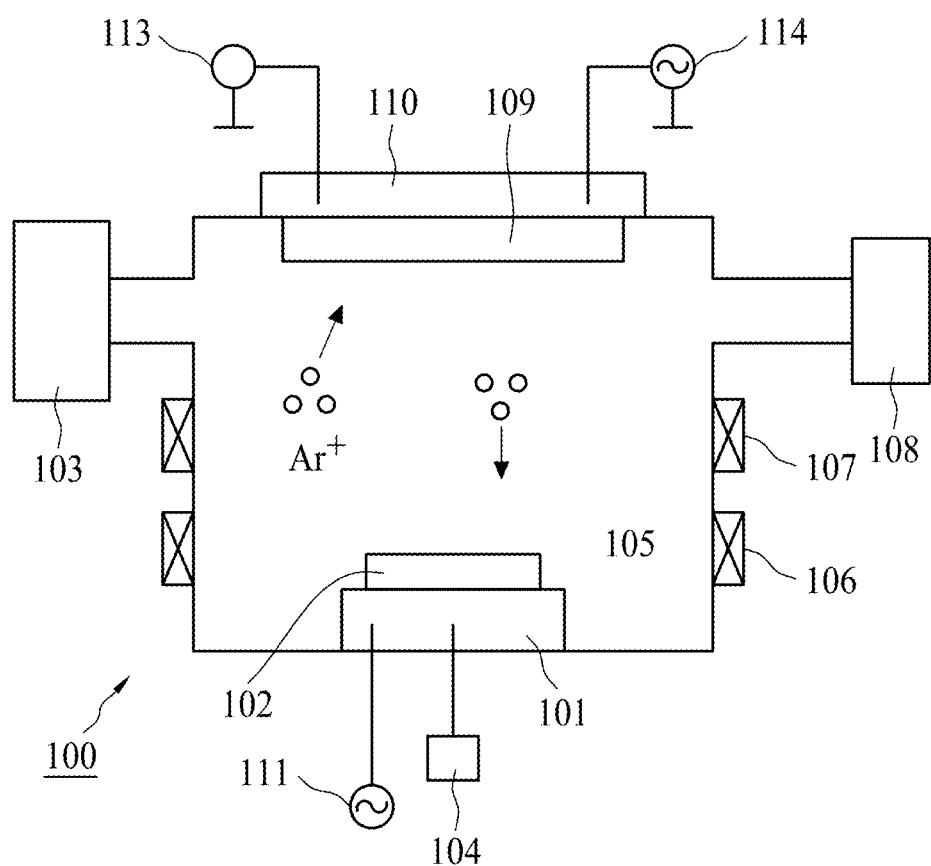
FIG. 1 is a magnetic-controlled reactive sputter system/Radio Frequency (RF) capacitively coupled plasma (CCP) sputter system according to the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some exemplary metal formation operations are disclosed below. During the exemplary metal formation operations, openings of a damascene structure are filled with the conductive structure from the bottom of the openings. The exemplary metal formation operations are suitable for forming conductive interconnect of a semiconductor device below the 38 nanometer (N38) technology node, especially below N10. Voids inside the conductive structure are avoided. When the feature of the semiconductor device shrinks strictly, the above metal formation operations advantageously provide excellent gap-filling ability by making the copper reflow on the conventional barrier or liner such as TaN or Ta layer without inserting another wetting layer.

In BEOL fabrication operations, the patterning operations may comprise two common operations such as "single damascene operation" and "dual damascene operation." In both single damascene and dual damascene operations, forming the interconnect structure may comprise forming openings and filling the metal into the openings. Preferably, the metal structure filled into the openings should be a void-free structure. The embodiments of "single damascene operation" and "dual damascene operation" are described as follows.

In some embodiments, a manufacturing operation for a single damascene structure may comprise the following operations. A single damascene operation comprises that wire trenches or via openings are formed in a dielectric layer on a substrate, a conductive structure is deposited on the dielectric layer to fill the openings, and a chemical mechanical polish (CMP) process is performed to remove excess conductive structure and make the surface of the desired conductor co-planer with a top surface of the dielectric layer to form a single damascene interconnect structure.

In some embodiments, a manufacturing operation for a dual damascene structure may comprise the following operations. A dual damascene operation comprises forming wire trenches or via openings by performing photolithography and etching operations on a dielectric layer. In some embodiments, a deep via opening is firstly formed by performing a first set of photolithography and etching operations. After the formation of the deep via opening, a wire trench is formed by performing a second set of photolithography and etching operations. In another embodiment, a wire trench is firstly formed by performing a first set of photolithography and etching operations. After the formation of the wire trench, a deep via opening is formed by performing a second set of photolithography and etching operations. A conductive structure is then deposited into the wire trench and deep via to form a dual damascene interconnection structure. Chemical mechanical polishing (CMP) is used to remove the excess conductive structure, and make the surface of the desired conductor co-planer with a top surface of the dielectric layer to form a dual damascene interconnect structure. A dual damascene structure is thus a special case of a single damascene structure.

For illustrative purposes, the present disclosure is described for a single damascene structure. However, variations of the present disclosure for a dual damascene integration operation are contemplated. In some embodiments, the present disclosure can be applied for a single damascene operation or a dual damascene operation.

Referring to FIG. 1, a magnetic-controlled reactive sputter system 100 is provided. In some embodiments, the sputter system 100 can be a direct-current (DC) magnetron sputter system, or a Radio Frequency (RF) capacitively coupled plasma (CCP) sputter system, or an Inductively Coupled Plasma (ICP) system. The sputter system 100 has a chamber 105 configured as a space for manufacturing a semiconductor wafer. A pedestal 101 is located on one side of the chamber and a target 109 is disposed on a side opposite to the pedestal 101. In some embodiments, the target 109 is facing the pedestal 101 but separated with a predetermined distance. A gas supply 103 is connected to an inlet of the chamber 105. However, the chamber 105 may be connected with more than one gas supply if required. A pump 108 is connected to the chamber 105 on one side in order to provide a high vacuum environment for the chamber 105. There may be a foreline further connected to the pump 108 at downstream to vent gas from chamber 105 into abatement. A wafer 102 is provided on the pedestal 101. A bias power 104 is coupled to the pedestal 101 for providing a substrate bias to the pedestal for biasing the wafer 102 to attract the deposition material atoms from the target 109. In some embodiments, the material atoms are ionized to become ionized particles. In some embodiments, the target 109 is biased by a variable DC/AC power source (which is not shown in FIG. 1) at a DC/AC power. When the variable DC power source biases the target 109, the plasma is ignited and further maintained.

Gas such as Ar is introduced from the gas supply 103 and delivered into the chamber 105 and an electric field is applied on the gas to generate ionization collision. The ionized gas atoms (like Ar$^+$) are guided to bombard the target 109 and dislodge atoms from the target 109. In order to increase the bombardment efficiency, a magnetron 110 is adopted to generate a magnetic field near the target 109 so as to increase the density of ionized gas atoms. The magnetron 110 is located proximal to the ceiling of the chamber 105 and may be disposed on an external surface of the chamber 105 as shown in FIG. 1. A DC bias power 113 is coupled to the magnetron 110 for ionizing the gas atoms and the falling metal atoms from the target 109. In some embodiments, the target 109 is made of metal such as Cu, Al, etc. The metal atoms dislodged from the target 109 by the ionized gas atoms fall down and move toward the wafer 102. In some embodiments of the Inductively Coupled Plasma (ICP) system, plasma ionizers 106 and 107 are disposed between the target 109 and pedestal 101 in order to ionize the falling metal atoms before the metal atoms reach the wafer 102. In some embodiments, the plasma ionizers 106 and 107 are coils surrounding the chamber 105 and locate between the target 109 and pedestal 101. The coils 106 and 107 may be respectively powered by separate sources. The plasma created by the coils 106 and 107 ionizes a substantial portion (for example, over 80%) of the sputtered metal atoms falling from the target 101. The sputtered metal atoms are ionized under a predetermined frequency and a predetermined pressure. In some embodiments, the sputtered metal atoms are ionized under a high radio frequency between about 13.56 MHz and about 40 MHz, and a pressure between about 1 mTorr and about 150 mTorr. The settings of the predetermined frequency and pressure further increase the collision possibility to induce high ion density plasma.

In some embodiments, in a Radio Frequency (RF) capacitively coupled plasma (CCP) sputter system, the pedestal 101 is also connected to a high radio frequency (RF) power source 111. In some embodiments, the magnetron 110 can be connected to a high radio frequency (RF) power source 114. The high RF power source 111 provides a high RF power, such as 13.56 MHz, 27 MHz, 40 MHz, 60 MHz, or 100 MHz, to the pedestal 101 to capacitively couple the RF energy into the plasma. The high RF power source 114 provides a high RF power, such as 13.56 MHz, 27 MHz, 40 MHz, 60 MHz, or 100 MHz, to the magnetron 110 to capacitively couple the RF energy into the plasma. In some embodiments, the ionized metal atoms are directed to the wafer 102 by the bias power 104. This directed flux of metal atoms is necessary to ensure the metal species being able to reach the bottom of deep vias or openings. The ionized atoms may be controlled by the substrate bias to achieve high directional control. For a CCP sputter system, there are two RF power sources 114 and 111 can be used for providing the ion energy into the plasma. The DC bias power 113 can be also coupled to a magnetron 110 in parallel.

In some embodiments, a magnetic field generated by the coils in combination with a magnetron 110 positioned adjacent to the target 109. In some embodiments, the target 109, wafer 102, and pedestal 101 are coaxially aligned on a central chamber axis. The magnetic field generated by the coils in combination with a magnetron 110 has a null region near the target 109 and a higher field strength in an area near the wafer 102 and the pedestal 101. It is believed that the magnetic field generated by the coils in combination with a magnetron 110 tends to confine the plasma to increase plasma bulk density adjacent the wafer 102. As a consequence, the ionization of the precursor gas may be increased to enhance the resputtering of the wafer 102. In addition, the resultant magnetic field is believed to influence the distribution of the ion flux to the wafer 102. For a direct-current (DC) magnetron sputter system, there is no RF power connected to the magnetron 110. The DC bias power 113 is coupled to a magnetron 110 for ionization and the RF power source 111 is connected to pedestal 101 for providing the ion energy into the plasma.

In the present disclosure, the sputter system 100 illustrated in FIG. 1 is utilized to perform various metal formation operations on a semiconductor device or wafer. Some of the metal formation operations are designed for ultra small technology node semiconductor devices, for example, a sub 38 nm or below. The technology node is referred to the smallest gate dimension in the semiconductor devices. In some embodiments, the smallest gate dimension is also called critical dimension (CD) of gate length. In some embodiments, a critical dimension (CD) of the damascene structure is less than about 25 nm. For the ultra small technology node semiconductor devices, a metallization feature known as damascene is widely used to form conductive interconnect above the gate. A portion of dielectric is carved out to form recessed features such as vias, openings, or trenches for metal to fill in. As geometry (diameter or width) of the recessed feature shrinks below certain degree, say under 40 nm, the directional metal formation operations can fill metal in the recessed feature in bottom-up manner without pinch-off.

An exemplary method for forming a semiconductor device with damascene structures by using the sputter system 100 is illustrated in FIGS. 2A-2G, which shows sequential cross-sectional side views at different stages of fabrication.

Figure 2A:
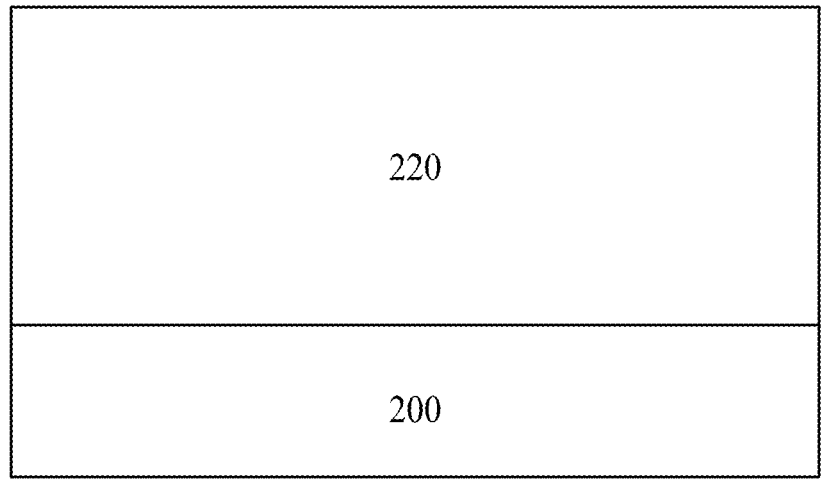
FIG. 2A to FIG. 2G are an exemplary method for forming a semiconductor device with damascene structures according to the present disclosure.

Referring to FIG. 2A, a method for forming a semiconductor device comprises providing a substrate 200 and forming a dielectric layer 220 on the substrate. In the substrate 200, some features are omitted for simplification. For example, the substrate 200 may include CMOS transistors or other electric components such as resistor, diode. Each CMOS transistor may have several doped regions and a gate. In some embodiments, the gate is a metal gate (or replacement gate) with a gate length smaller than about 38 nm or about 10 nm. The substrate 200 also includes several materials such as silicon, GaAs, germanium or other suitable semiconductive materials. The dielectric layer 220 can be formed in various operations, such as chemical vapor deposition (CVD) or spin-coating. The dielectric 220 covers on the substrate 200 and provides electric isolation between the substrate 200 and overlaid conductive features. The dielectric layer 220 includes dielectric material such as silicon oxide ($SiO_2$), silicon nitride (SiN), organosilicate glass (OSG), SiCOH, a spin-on low-k dielectric material such as SiLK™, etc. The dielectric layer 220 may be porous or non-porous material.

Figure 2B:
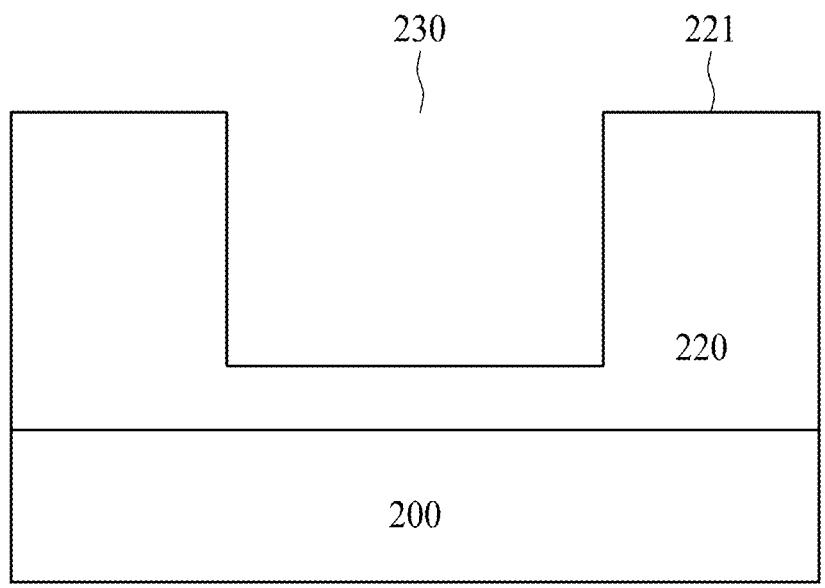

Referring to FIG. 2B, a damascene operation comprises forming openings 210 by performing photolithography and etching operations on the dielectric layer 220. After implementing the etching operations to the dielectric layer 220, an opening 230 is formed. The dielectric layer 220 is a damascene structure. In various embodiments, etching operations may be accomplished by selection of etching gas chemistries, materials with different etch selectivity, etching operation depth control by utilizing an etching equipment, or a combination thereof. Suitable etching gases may include HBr, Cl2, CH4, CHF3, CH2F2, CF4, Ar, H2, N2, and others, but not limited.

Figure 2C:
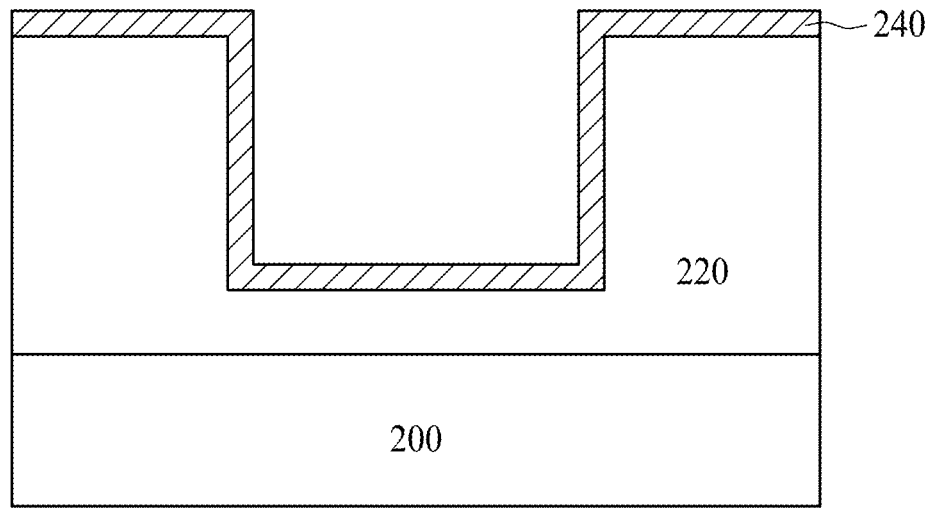

Referring to FIG. 2C, a damascene operation further comprises forming a barrier layer 240 on the dielectric layer 220. In some embodiments, the barrier layer 240 may be formed only on a sidewall of the opening 230 and the barrier layer 240 would not be formed on the top surface 221 of the dielectric layer 220. In some embodiments, the barrier layer 240 may be a metallic nitride compound which may comprise TiN, TaN, WN, MoN, OsN or MnN, etc. The barrier layer 240 is formed to prevent diffusion of contaminants from and/or into an opening like trench/via and may promote adhesion of the conductive structure 280 to the dielectric layer 220. The barrier layer 240 may be formed by chemical vapor deposition (CVD), physical vapor deposition (PVD), plasma enhanced chemical vapor deposition (PECVD), low pressure chemical vapor deposition (LP-CVD), high density plasma chemical vapor deposition (HDP-CVD) or atomic layer deposition (ALD), etc. The thickness of the barrier layer 240 ranges typically from about 20 Angstrom (Å) to about 500 Å, although lesser and greater thicknesses are also contemplated herein.

Figure 2D:
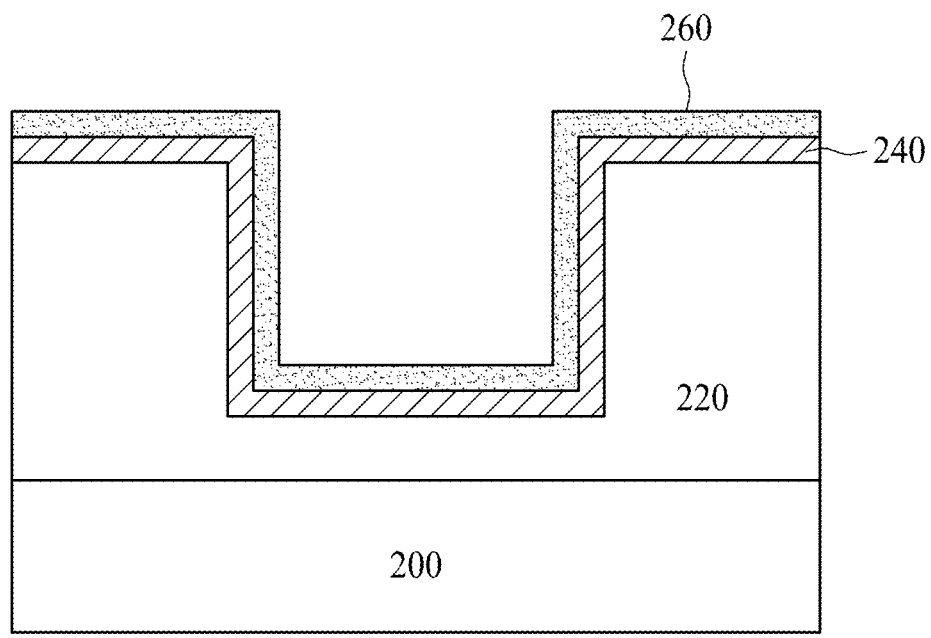

Referring to FIG. 2D, after the operation of forming the barrier layer 240, the operation further comprises forming a glue layer 260 on the barrier layer 240. In some embodiments, the glue layer 260 includes Ti, Ta, W, Mo, Co, TiW, Os, or Mn, etc. The glue layer 260, being similar to the barrier layer 240, is formed to prevent diffusion of contaminants from and/or into an opening like trench/via or promotes adhesion between the conductive structure 280 and the barrier layer 240. The glue layer 260 may be formed in the same manner as the barrier layer 240. The thickness of the glue layer 260 ranges typically from about 20 Å to about 500 Å, although smaller and greater thicknesses are also contemplated herein.

In some embodiments, the glue layer 260 can be formed on the dielectric layer 220 without forming the barrier layer 240. In other words, the forming of the barrier layer 240 is optional. In some embodiments, the forming of the glue layer 260 is optional and only the barrier layer 240 is formed on the dielectric layer 220 and the forming of the glue layer 260 can be skipped. In some embodiments, the glue layer 260 may be formed on a portion of the barrier layer 240 instead of full coverage, for example, only on the barrier layer extending along the sidewall of the opening 230.

Figure 2E:
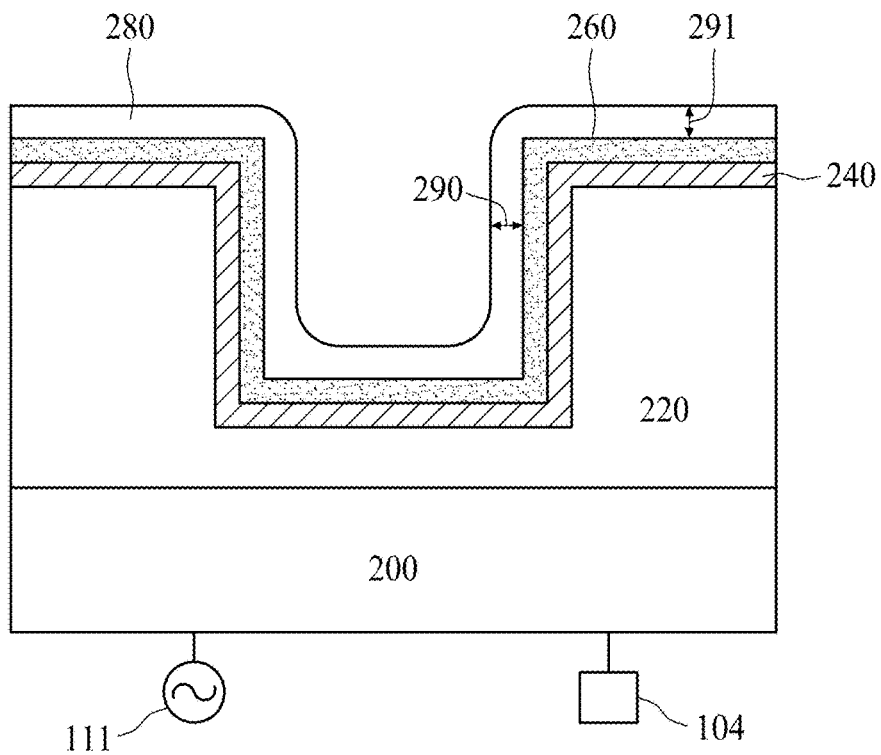

Referring to FIG. 2E, a conductive structure 280 is formed on the glue layer 260 by sputtering deposition. The conductive structure 280 may be a Cu structure or a noble metal structure. For example, during the sputtering deposition, a Cu target may be provided for the sputtering deposition, and thus the conductive structure 280 is made of Cu. In some embodiments, the Cu atoms provided from the Cu target are ionized in a system like the sputter system 100 in FIG. 1. A substrate bias is provided from a bias supply 104 to the substrate 200 for directing the ionized Cu atoms. The substrate bias comprising the AC (alternate current) bias or DC bias (wafer bias) provided by a bias supply/bias source 104 is between about 500 w to about 1500 w. The DC bias provided by the DC bias power 113 is between about 500 w to about 1500 w. In some embodiments, the substrate bias provided by the bias supply 104 and the DC bias provided by the DC bias power 113 are greater than about 600 W. The deposition direction of the ionized Cu atoms is controlled by the substrate bias such that the conductive structure 280 may be formed on the barrier layer 240 or the glue layer 260. In some embodiments, an ACT current from about 5 mA to about 50 mA is supplied to the high radio frequency (RF) power source 111 which provides a high RF power with various frequencies, such as 13.56 MHz, 27 MHz, 40 MHz, 60 MHz, or 100 MHz, to the pedestal 101 to capacitively couple the RF energy into the plasma. In some embodiments, an ACT current from about 5 mA to about 50 mA is supplied to the high radio frequency (RF) power source 114 which provides a high RF power with various frequencies, such as 13.56 MHz, 27 MHz, 40 MHz, 60 MHz, or 100 MHz, to the magnetron 110 to capacitively couple the RF energy into the plasma. In some embodiments, high ion density of the ionized atoms is achieved. The ionized ratio of the Cu atoms is able to be more than about 80%. In some embodiments, the ionized ratio of the Cu atoms may be more than about 99%. In some embodiments, the traversal length of the conductive structure 280 is less than about 38 nm.

The conductive structure 280 is configured to possess a profile, i.e. a ratio which defines the thickness of the conductive structure 280 on sidewall portion of the barrier layer 240/glue layer 260 (or called the sidewall thickness 290 of the conductive structure 280) to the thickness of the conductive structure 280 over the top surface 221 (the "field"). In some embodiments, the ratio is substantially greater than about 1. That is, the sidewall thickness 290 of the conductive structure 280 is substantially greater than or equal to the thickness 291 of the conductive structure 280 over the top surface 221. In some embodiments, the thickness 291 over the top surface 221 is measured at a middle point between two adjacent openings. The sidewall thickness 290 of the conductive structure 280 may be uniform and is defined to be measured at a location around mid-height of the sidewall portion of the glue layer 260, and from the interface between the glue layer 260 and the conductive structure 280. For embodiments without a glue layer interposed between the conductive structure 280 and the conductive structure 280, the sidewall thickness 290 is calculated from the surface of the middle portion of the sidewall of the barrier layer 240. In some embodiments, the sidewall thickness 290 may be not uniform, and the lower portion of the sidewall thickness 290 may be greater near the bottom of the opening 230, and the thinner part is around the top surface 221. In some embodiments, the lower portion of the sidewall thickness 290 may be thinner around the bottom of the opening 230, and the thicker portion is around the top surface 221.

In some embodiments, a substrate bias is provided from a bias power 104 to the substrate 100 for directing the ionized Cu atoms during the deposition. In some embodiments, the substrate bias provided by the bias power 104 between about 500 w to about 150 w. The bias provided by the DC bias power 113 is between about 500 w to about 1500 w. The travelling direction of the ionized Cu atoms is controlled by the substrate bias such that the conductive structure 280 may be formed on the surface of the glue layer 260. In some embodiments, the conductive structure 280 may be formed on the surface of the barrier layer 240. In some embodiments, the conductive structure 280 with a thickness less than 50 angstroms Å) is formed on the top surface 221 of the dielectric layer 220 without voids when the gate CD shrinks below N38, especially below N10.

During the deposition, a parameter called resputter ratio is a tuning knob for some embodiments. The resputter ratio is a measurement of gratitude of the substrate bias applied on the wafer. For example, when measuring a resputter ratio of a Cu film. A first thickness of a Cu film deposited without bias applied on the substrate is measured as $T_1$. A second thickness of a Cu film deposited with a predetermined bias applied on the substrate is measured as $T_2$. The resputter ratio of the Cu deposition under the predetermined bias is defined as $T_1/T_2$.

In some embodiments, the resputter ratio of the Cu deposition is substantially greater than 2.5. The resputter ratio can be illustrated as the function: A/B, wherein A refers to forming the sidewall thickness of the conductive structure 280 without applying any substrate bias to the substrate 100 in a predetermined seconds; and B refers to forming the sidewall thickness of the conductive structure 280 with applying a predetermined substrate bias to the substrate 100 in a predetermined seconds. In some embodiments, the substrate bias and the DC bias provided by the DC bias power 113 are between about 500 w to about 1500 w.

In some embodiments, after the operation of forming a conductive structure 280 on the glue layer 260 by using a sputtering deposition, an operation is performed to post anneal the copper layer to make the copper reflow with a predetermined temperature and time. In some embodiments, the range of the temperature for post annealing the copper layer is around 150-200° C. In some embodiments, the range of the temperature for post annealing the copper layer is from about 200° C. to 250° C., from about 250° C. to 300° C., from about 300 to 350° C., from about 350 to 400° C., from about 400 to 450° C., and from about 450 to 500° C.

In some embodiments, the range of the of the concentration of Hydrogen gas for post annealing the copper layer is from about 0% to 20%. In some embodiments, the range of the of the concentration of Hydrogen gas is from about 20% to 40%, from about 40% to 60%, from about 60% to 80%, or from about 80% to 100%.

In some embodiments, the range of the time for post annealing the copper layer is from about 3 seconds to 120 seconds. In some embodiments, the range of the time is from about 120 seconds to 240 seconds, from about 240 seconds to 360 seconds, from about 360 seconds to 480 seconds, or from about 480 seconds to 600 seconds.

Figure 2F:
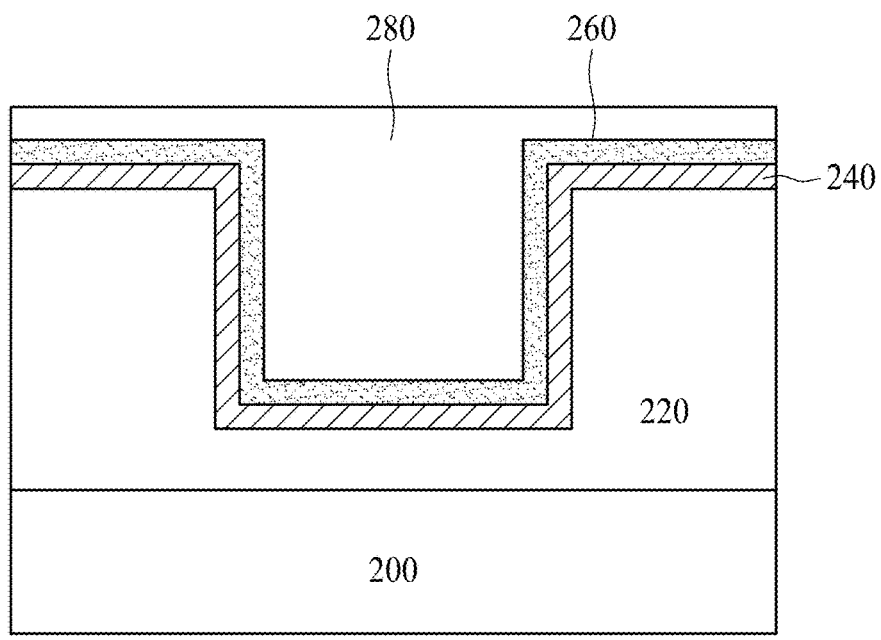

Referring to FIG. 2F, a fill-in operation is performed on the conductive structure 280 and the metal material is further formed on the conductive structure 280 in order to fill the openings 230. The fill-in operation can be performed either by the same Cu deposition adopted in FIG. 2E or by an ECP process. The metal material further formed may include Cu or Cu alloy.

Figure 2G:
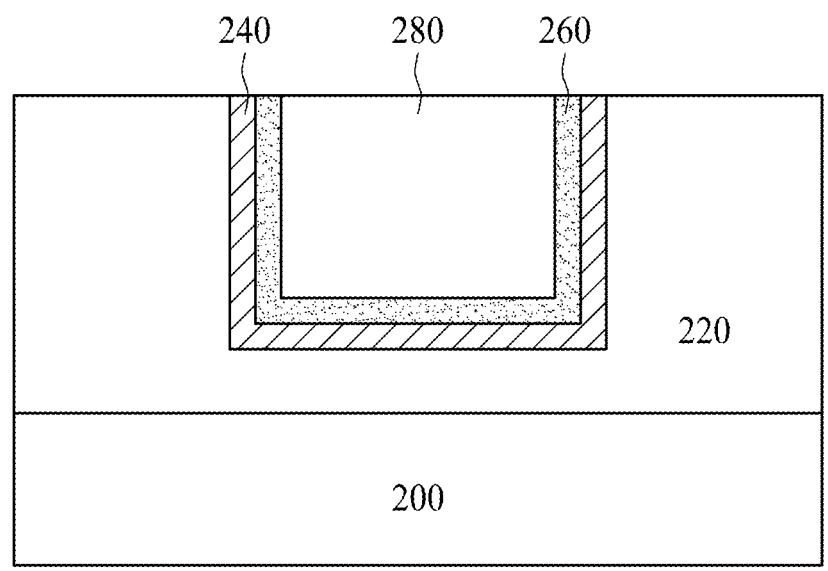

Referring to FIG. 2G, some portions of the conductive structure 280 and some portions of the barrier layer 240, the glue layer 260 and the dielectric layer 220 are removed by using a CMP operation. After implementation of the removing operation, interconnects 280 which may be a void-free structure are completed in the damascene structure. In some embodiments, multi-CMP operations may be combined. For example, overburden portions of the conductive structure 280 are firstly removed by a first-stage CMP operation, and then, some portions of the barrier layer 240, the glue layer 260 and the dielectric layer 220 are removed by a second-stage CMP operation. The interconnects 280 are completed after the remove operations. In some embodiments, an impurity concentration of the conductive structure 280 is below about 1 ppm. In general, an impurity concentration of Cu for ECP deposition is from about 20 ppm to about 400 ppm. However, in the present disclosure, an impurity concentration of the conductive structure 280 approaches to zero, e.g., the impurity concentration is equal to or below 1 ppm.

Figure 3:
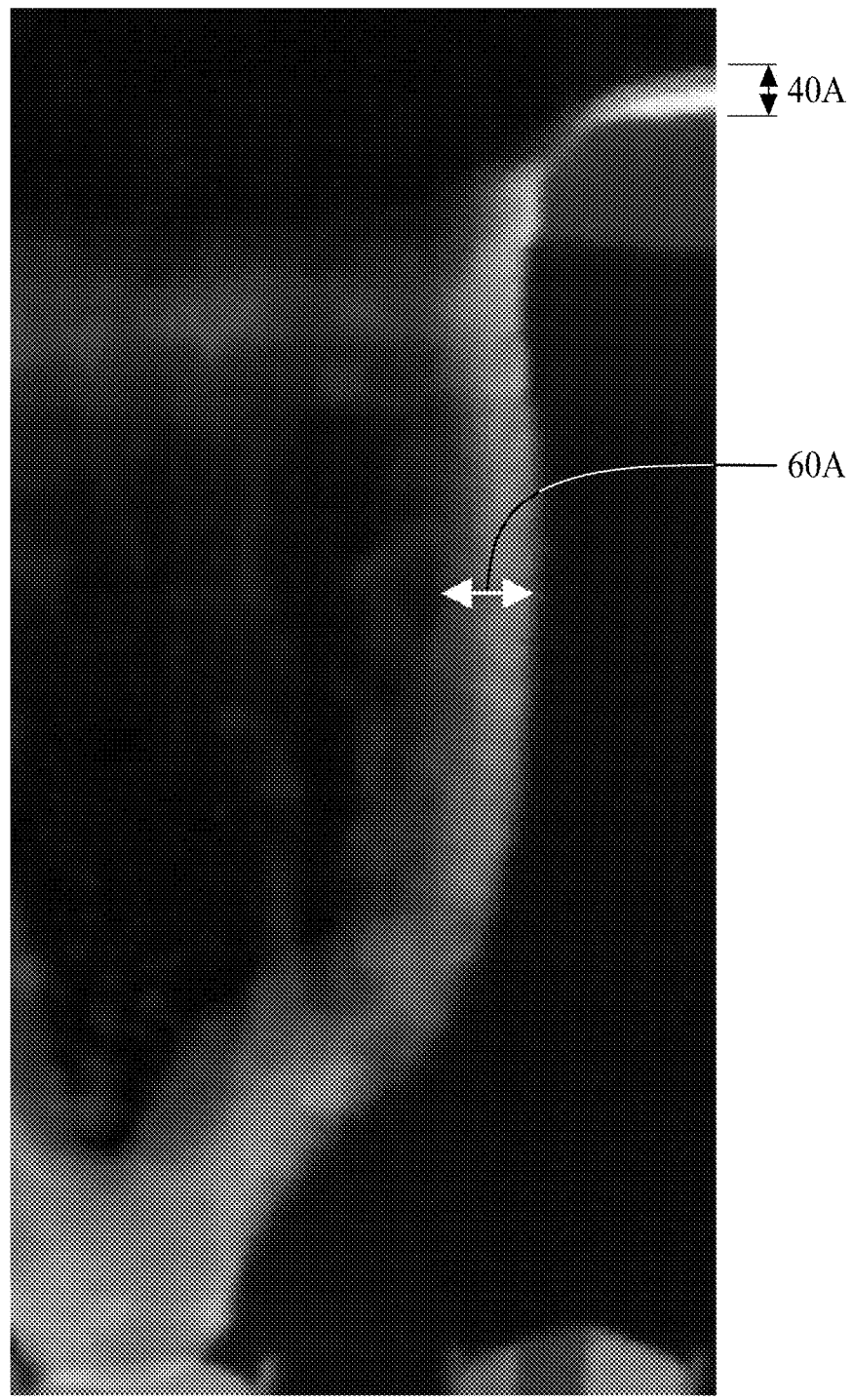
FIG. 3 is an exemplary damascene structure according to the present disclosure.

Referring to FIG. 3, the structure of FIG. 3 corresponds to that of FIG. 2E. The damascene structure of FIG. 3 shows that the operation of depositing the conductive structure 280 is performed with a substrate bias about 800 W and the relevant resputter ratio is 3.1. As shown in FIG. 3, the sidewall thickness of the conductive structure 280 is about 60 Å and the thickness of the field of Cu is about 40 Å.

In some embodiments, a semiconductor structure comprises a substrate; a dielectric on the substrate; and a damascene interconnect structure with a critical dimension (CD) less than about 25 nm and surrounded by the dielectric, wherein the damascene interconnect comprises: a barrier layer adjacent the dielectric and the barrier layer comprising a metallic nitride compound, a copper film with an impurity concentration below about 1 ppm disposed over the barrier layer.

In some embodiments, a method of forming a semiconductor structure comprises: providing a substrate; forming a dielectric on the substrate; forming an opening recessed under a top surface of the dielectric; forming a barrier layer on a sidewall of the opening; performing a physical vapor deposition (PVD) to form a copper layer over the barrier layer, a corner of the opening intersecting with the top surface and the top surface with a predetermined resputter ratio so that the ratio of the thickness of the copper layer on the barrier layer and the thickness of the copper layer over the top surface is substantially greater than 1.

In some embodiments, a method of forming a semiconductor structure comprises: providing a substrate; forming a dielectric on the substrate; forming a trench recessed under a top surface of the dielectric; forming a barrier layer on a sidewall of the trench; forming a glue layer on the barrier layer; performing a physical vapor deposition (PVD) by using a Radio Frequency (RF) capacitively coupled plasma (CCP) sputter system to form a copper layer over the glue layer, a corner of the trench intersecting with the top surface and the top surface with a predetermined resputter ratio so that the ratio of the thickness of the copper layer on the glue layer and the thickness of the copper layer over the top surface is substantially greater than 1, wherein the Activation (ACT) current in the RF CCP sputter system is about 5 mA to 5 0mA and the resputter ratio is substantially greater than 2.5; post annealing to reflow the copper layer with a predetermined temperature and time and a predetermined concentration of Hydrogen gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    providing a substrate;
    forming a dielectric over the substrate; forming a trench recessed under a top surface of the dielectric;
    forming a barrier layer on a lateral sidewall of the trench; and
    depositing a first copper layer over the barrier layer and the top surface of the dielectric, wherein the depositing provides a ratio of the thickness of the first copper layer on the barrier layer at a middle portion of the lateral sidewall and the thickness of the first copper layer over the top surface is greater than 1.

2. The method according to claim 1, wherein the depositing the first copper layer comprises performing a physical vapor deposition (PVD) by using a Radio Frequency (RF) capacitively coupled plasma (CCP) sputter system, a predetermined resputter ratio, which is a ratio of the thickness of the first copper layer applied to the substrate without a substrate bias to the thickness of first copper layer applied to the substrate with the substrate bias, is controlled so that the ratio of the thickness of the first copper layer on the barrier layer at the lateral sidewall and the thickness of the first copper layer over the top surface is greater than 1.

3. The method according to claim 2, wherein the Activation (ACT) current in the RF CCP sputter system is about from 5 mA to 50 mA.

4. The method according to claim 1, further comprising a fill-in operation by depositing a second copper layer in the trench over the first copper layer.

5. The method according to claim 4, further comprising performing an annealing operation over the first copper layer and prior to the depositing of the second copper layer.

6. A method of forming a semiconductor structure, comprising:
    providing a substrate;
    forming a dielectric over the substrate;
    forming an opening recessed under a top surface of the dielectric;
    forming a barrier layer on a sidewall of the opening;
    performing a physical vapor deposition (PVD) to form a copper layer over the barrier layer; and
    reflowing the copper layer by an annealing operation,
    wherein a resputter ratio, which is a ratio of the thickness of the copper layer applied to the substrate without a substrate bias to the thickness of copper layer applied to the substrate with the substrate bias, is greater than 2.5.

7. The method according to claim 6, wherein the performing a physical vapor deposition (PVD) comprises using a direct-current (DC) magnetron sputter system.

8. The method according to claim 7, wherein an AC (alternate current) bias or DC bias (wafer bias) in the DC magnetron sputter system is greater than 600 W.

9. The method according to claim 6, wherein the barrier layer is a metallic nitride compound comprises TiN, TaN, WN, MoN, OsN or MnN.

10. The method according to claim 6, further comprising a fill-in operation which fills the opening with conductive materials.

11. The method according to claim 10, wherein the fill-in operation comprises performing a PVD operation.

12. The method according to claim 6, wherein:
    a range of a temperature for the annealing operation is around 150-500° C.,
    a range of a concentration of Hydrogen gas is around 0% to 100%, and
    a range of a time for the annealing operation is around 3-600 seconds.

13. The method according to claim 6, wherein an impurity concentration of the copper layer is below about 1 ppm.

14. The method according to claim 6, wherein a critical dimension of the semiconductor structure is less than about 25 nm.

15. A method of forming a semiconductor structure, comprising:
    forming a substrate;
    forming a dielectric over the substrate;
    forming a damascene interconnect structure with a critical dimension (CD) less than about 38 nm and surrounded by the dielectric, wherein the damascene interconnect comprises: a barrier layer adjacent to a sidewall of the dielectric and the barrier layer comprising a metallic nitride compound; and
    forming a first copper film in a deposition operation with an impurity concentration below about 1 ppm disposed over the barrier layer and the top surface of the dielectric, wherein the deposition operation provides a ratio of a thickness of the first copper film at a middle portion of a lateral sidewall of the dielectric and a thickness of the first copper film over a top surface of the dielectric is greater than 1.

16. The method of claim 15, wherein the metallic nitride compound comprises TiN, TaN, WN, MoN, OsN, or MnN.

17. The method of claim 15, further comprising a glue layer over the barrier layer.

18. The method of claim 17, wherein the glue layer comprises Ti, Ta, W, Mo, Co, TiW, Os, or Mn.

19. The method of claim 15, wherein the CD is less than about 25 nm.

20. The method of claim 15, further comprising performing a fill-in operation by depositing a second copper film over the first copper film at the lateral sidewall and the top surface of the dielectric.

\* \* \* \* \*